United States Patent
Uhlig et al.

(10) Patent No.: US 8,222,679 B2
(45) Date of Patent: Jul. 17, 2012

(54) SEMICONDUCTOR COMPONENT WITH INTEGRATED HALL EFFECT SENSOR

(75) Inventors: Thomas Uhlig, Dresden (DE); Felix Fuernhammer, Dresden (DE); Christoph Ellmers, Dresden (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 222 days.

(21) Appl. No.: 12/593,493

(22) PCT Filed: Mar. 26, 2008

(86) PCT No.: PCT/EP2008/053572
§ 371 (c)(1),
(2), (4) Date: Apr. 16, 2010

(87) PCT Pub. No.: WO2008/116883
PCT Pub. Date: Oct. 2, 2008

(65) Prior Publication Data
US 2011/0127583 A1    Jun. 2, 2011

(30) Foreign Application Priority Data

Mar. 26, 2007 (DE) .......... 10 2007 016 091
Jul. 23, 2007 (DE) .......... 10 2007 034 803

(51) Int. Cl.
*H01L 29/66* (2006.01)
(52) U.S. Cl. .......... 257/252; 438/48; 257/E27.005
(58) Field of Classification Search .......... 257/252, 257/E27.005; 438/48, 51, 54
See application file for complete search history.

(56) References Cited

U.S. PATENT DOCUMENTS

| | | | |
|---|---|---|---|
| 4,929,993 A | 5/1990 | Popovic | |
| 5,627,398 A | 5/1997 | Zlebir et al. | |
| 6,255,190 B1 | 7/2001 | Kroener | |
| 2003/0193067 A1 | 10/2003 | Kim et al. | |
| 2004/0025743 A1 | 2/2004 | Wakizaka et al. | |
| 2004/0173859 A1 | 9/2004 | Hao et al. | |
| 2004/0207031 A1 | 10/2004 | Berndt et al. | |
| 2005/0230770 A1* | 10/2005 | Oohira .......... | 257/421 |

FOREIGN PATENT DOCUMENTS

| | | |
|---|---|---|
| EP | 0 106 943 | 5/1984 |
| EP | 1 679 524 | 7/2006 |
| EP | 1 720 026 | 11/2006 |
| WO | WO 2004/025743 | 3/2004 |

OTHER PUBLICATIONS

Portmann, 28.1: A SOI CMOS Hall Effect Sensor Architecture for High Temperature Applications (up to 300°C), IEEE (2002).
International Search Report for International Application No. PCT/EP2008/053572 mailed on Aug. 28, 2008.

* cited by examiner

*Primary Examiner* — Tony Tran
(74) *Attorney, Agent, or Firm* — Hunton & Williams LLP

(57) ABSTRACT

A semiconductor device with an integrated circuit on a semiconductor substrate comprises a Hall effect sensor in a first active region and a lateral high voltage MOS transistor in a second active region. The semiconductor device of the present invention is characterized in that the structure of the integrated Hall effect sensor is strongly related with the structure of a high-voltage DMOS transistor. The integrated Hall effect sensor is in some features similar to a per se known high-voltage DMOS transistor having a double RESURF structure. The control contacts of the Hall effect sensor correspond to the source and drain contacts of the high-voltage DMOS transistor. The semiconductor device of the present invention allows a simplification of the process integration.

15 Claims, 2 Drawing Sheets

SEMICONDUCTOR COMPONENT WITH INTEGRATED HALL EFFECT SENSOR

CROSS REFERENCE TO RELATED APPLICATION

This application is a U.S. National Stage Application of International Application of PCT/EP2008/053572, filed Mar. 26, 2008, which claims the benefit of German Patent Application No. 10 2007 016 091.9 filed Mar. 26, 2007, and German Patent Application No. 10 2007 034 803.9 filed Jul. 23, 2007, the disclosures of which are herein incorporated by reference in their entirety.

FIELD OF THE DISCLOSURE

The present invention relates to a semiconductor device comprising an integrated circuit on a semiconductor substrate, which circuit includes a Hall effect sensor in a first active region and a lateral high-voltage MOS transistor in a second active region.

BACKGROUND OF THE DISCLOSURE

Lateral high-voltage MOS transistors including an n-type conductive channel are typically fabricated on wafers of p-type conductivity in the form of DMOS transistors in which a topology of the doped zones corresponds to a "double diffused" MOS (in short DMOS) transistor, wherein a drain region is of the same conductivity type as a well doping, that is, of an n-type conductivity. Lateral high-voltage MOS transistors having a p-type conductive channel, i.e. being complementary laterally high-voltage MOS transistors with respect to the previous type referred to, are typically formed on p-type conductive wafers in the form of drain extension transistors, in which drain and drift regions are of an inverse conductivity type compared to the n-well that is also present in this case. Both transistor types are commonly referred to as lateral high-voltage MOS transistors in the context of this application.

In lateral DMOS (LDMOS) transistors for applications at high electrical voltages it is known from US2003/0193067 A1 (FIG. 2) to use a so-called double RESURF structure. RESURF is the abbreviation of the English term reduced surface field.

From U.S. Pat. No. 5,627,398 a Hall effect sensor is known, which represents an element of an integrated CMOS circuit.

From WO 2004/025743 A2 a Hall effect sensor is known in which a structure of nested doped regions with alternating conductivity is provided in a semiconductor substrate. In this structure is an inner first doped region extending to the surface of the semiconductor substrate surrounded by a central doped region in the shape of a "U", which in turn is surrounded by an outer doped region, also in the shape of a "U". The central doped region comprises a buried active section forming a Hall plate.

The technical problem underlying the present invention is to provide a semiconductor device as specified above, which enables a particularly simple fabrication of the semiconductor device by means of an alternative structure of the Hall effect sensor.

SUMMARY OF THE DISCLOSURE

The technical problem is solved by a semiconductor device comprising an integrated circuit on a semiconductor substrate, which circuit comprises a Hall effect sensor in a first active region and a lateral high-voltage MOS transistor in a second active region wherein the Hall effect sensor comprises:

a first doped region of a first conductivity type, hereinafter referred to as drift zone, in the semiconductor substrate;
first and second doped contact regions of the first conductivity type that are connected to the drift zone for generating a majority charge carrier current in the drift zone by applying a supply voltage across the doped contact regions;
a second doped region of a second inverse conductivity type, which is positioned in or in other words: with respect to, a depth direction pointing to the interior of the substrate above the drift zone;
a third doped region of the second conductivity type, which is positioned below the drift zone with respect to the depth direction with a first distance with respect to the second doped region and which laterally overlaps in particular in a first lateral direction with the second doped region
wherein the first distance and the lateral extension of the second and third doped regions are selected such that upon applying the operating voltage across the doped contact regions the majority charge carrier current between the first and second doped contact regions flows in the first lateral direction through a current flow plane of the drift zone positioned between the second and the third doped regions with respect to the depth direction; and
sensor contacts having a second distance to each other in a second lateral direction that is perpendicular to the first lateral direction wherein the sensor contacts are connected to the drift zone and are positioned and configured such that upon applying the operating voltage across the doped control contact regions a Hall voltage can be tapped across the sensor contacts, which Hall voltage is generated in the presence of a magnetic field component perpendicular to the current flow plane; and
wherein the lateral high-voltage MOS transistor comprises in addition to a doped source region and a doped drain region:
a MOS transistor drift zone of the first conductivity type, which with respect to its dopant profile in the semiconductor substrate is equal to the first doped region of the Hall effect sensor;
an upper RESURF zone of the second conductivity type, which is adjacent to the MOS transistor drift zone in the depth direction and which is equal to the second doped region of the Hall effect sensor with respect to its dopant profile in the depth direction; and
a lower RESURF zone of the second conductivity type adjacent to the MOS transistor drift zone, wherein the lower RESURF zone has the first distance from the upper RESURF zone in the depth direction and is equal to the third doped region of the Hall effect sensor with respect to its dopant profile in the depth direction.

The semiconductor device of the present invention is advantageous in that the structure of the integrated Hall effect sensor is strongly related to the structure of a high voltage DMOS transistor. The integrated Hall effect sensor is similar to a per se known high-voltage DMOS transistor having a double RESURF structure according to some of the Hall effect sensor's features. The control contacts of the Hall effect sensor correspond to source and drain contacts of the high-voltage DMOS transistor. Examples of a high-voltage DMOS transistor are an NDMOS transistor and a PDMOS (drain extension MOS) transistor.

The semiconductor device of the present invention also enables the concurrent usage of features, which are also otherwise required for a Hall effect sensor, such that manufacturing recipes for the common features of the Hall effect sensor and the high-voltage DMOS transistor have to be designed only once and do not need to be individually designed. This represents a significant simplification of the process integration.

Furthermore, the mask layout is simplified compared to the described known solutions since also in this case common mask features can be used during the mask design for active regions of the semiconductor device including the Hall effect sensor and for active regions including a high-voltage DMOS transistor. Moreover, in this manner the number of the required mask steps for the semiconductor device may be kept at a low value, thereby reducing the manufacturing efforts as well as the costs of the semiconductor device.

Consequently, the semiconductor device of the present invention is particularly appropriate to being produced by a process technology that also enables the fabrication of a high-voltage DMOS transistor of structural similarity to a Hall effect sensor. This is, for instance, of importance for the fabrication of integrated circuits for applications in the automotive technology. In this field the usage of high voltage DMOS transistors is particularly important and in this field also Hall effect sensors have many applications.

In the above description of the inventive semiconductor device designations of directions are used for clarifying the arrangement of specific features to each other. The fact that the second doped region is positioned above the drift zone with respect to a depth direction pointing to the interior of the substrate is for example to be understood such that in a cross-sectional view of the semiconductor device the second doped region is positioned farther away from the interior of the substrate relative to the drift zone. The fact that the current flow plane is positioned between the second and the third doped regions in the depth direction means in other words that in the cross-sectional view the current flow plane is positioned between the second and the third doped regions in the direction from the substrate surface to the interior of the substrate.

In the following embodiments of the inventive semiconductor device are described. The embodiments may be combined with each other, unless this is explicitly excluded.

In one embodiment of the semiconductor device first and second doped contact regions of the first conductivity type are provided on a surface of the semiconductor substrate in the drift zone with each of the doped contact regions being connected to a respective one of the control contacts, wherein at least one of the doped contact regions has a greater dopant concentration compared to the drift zone. The doped contact region does not form a contact on its own, but is at most a part of the total contact structure. The doped contact regions in particular act to improve the majority charge carrier coupling (injection) into the drift zone and the coupling out of the drift zone, respectively.

In a further embodiment of the semiconductor device an insulation region is positioned in the first active region at a surface of the semiconductor substrate between the first and second doped contact regions in the first lateral direction and is adjacent to the second doped region with respect to the depth direction. Hence, in a top view of the semiconductor device along the first lateral direction, for instance, this sequence of features is obtained: first contact region—insulation region—second contact region.

In another embodiment a MOS transistor insulation region is positioned in the second active region, in other words: an insulation region associated with the high-voltage MOS transistor. The MOS transistor insulation region is positioned at a surface of the semiconductor substrate. It may be embedded in the MOS transistor drift zone, which in this embodiment is not only positioned below the insulation region but also surrounds the insulation region at the substrate surface according to a top view. At any rate, the MOS transistor insulation region is positioned between a source contact and a drain contact of the high-voltage MOS transistor in the first lateral direction without excluding that additionally also the MOS transistor drift zone is positioned between the source contact and the drain contact according to a top view. The extension of the MOS is transistor insulation region in the depth direction is less than that of the MOS transistor drift zone. It is advantageously the same as the extension of the insulation region of the Hall effect sensor in the depth direction such that these two insulation regions may be fabricated in one and the same process step. In one embodiment the upper doped RESURF region is positioned below the MOS transistor insulation region according to the depth direction.

In a further embodiment of the semiconductor device the doped contact regions extend from a surface of the semiconductor substrate to the drift zone in the depth direction and connect to the ends of the drift region in the first lateral direction, wherein at least one of the doped contact regions has a higher dopant concentration compared to the drift zone.

In a further embodiment of the semiconductor device the drift zone, the doped contact regions and the second and third doped regions are embedded in a doped body region of the second conductivity type in the first and second lateral directions. The second and third doped regions are in contact with the doped body region.

In a further embodiment of the semiconductor device the doped body region is embedded in a fourth doped region of the first conductivity type in a lateral direction and in the depth direction.

In a further embodiment of the semiconductor device the fourth doped region is formed as a well and is adjacent to the semiconductor substrate having the second conductivity type. This is herein also referred to as a deep well.

The doped body region may be used for insulating the drift region at the bottom with respect to a deep well of the first conductivity type and for generating a bias voltage, which may change the space charge region in the drift zone caused by the pn-junctions between the drift zone and the adjacent second and third doped regions such that a desired Hall resistance and thus a desired Hall sensitivity may be generated.

In a further embodiment of the semiconductor device therefore a third control contact is provided that is connected with the doped body region in order to apply a bias voltage that controls the extension of a space charge region+ in the drift zone.

In a further embodiment of the semiconductor device a third doped contact region is provided at a surface of the semiconductor substrate within the doped body region, wherein the third doped contact region is connected with the third control contact.

In a further embodiment of the semiconductor device the second and third doped regions are located at the same position as the insulation region with respect to the first lateral direction.

In a further embodiment of the semiconductor device the lateral extensions of the second and third doped regions in the first lateral direction are less or equal to the lateral extension of the insulation region in the first lateral direction.

In a further embodiment of the semiconductor device the second and third doped regions have the same lateral extension in the first lateral direction.

In a further embodiment of the semiconductor device the second doped region has a dopant concentration of $10^{15}$ to $5*10^{17}$ cm$^{-3}$.

In a further embodiment of the semiconductor device the drift zone has a dopant concentration of $10^{15}$ to $5*10^{17}$ cm$^{-3}$.

In a further embodiment of the semiconductor device the lateral extension of the drift zone between the first doped contact region is 2 to 50 micrometer.

In a further embodiment of the semiconductor device the distance between the sensor contacts with respect to the second lateral direction is 50 to 400 micrometer.

In a further embodiment of the semiconductor device the high voltage MOS transistor additionally comprises a doped source region and a doped drain region.

In a further embodiment of the semiconductor device the MOS transistor drift zone in the second active region and the drift zone in the first active region have an identical extension in the depth direction and also have identical dopant profiles in the depth direction.

In a further embodiment of the semiconductor device the integrated circuit is fabricated in CMOS technology.

In a further embodiment of the semiconductor device the integrated circuit additionally comprises an analog/digital/converter that is configured to detect at an input an electrical voltage between the sensor contact and to output at an output side a digital signal that is dependent on the detected electrical voltage.

BRIEF DESCRIPTION OF THE DRAWINGS

Further embodiments will be described in the following by referring to the attached Figures. In the Figures.

DETAILED DESCRIPTION OF EXEMPLARY EMBODIMENTS

For simplicity the drawings illustrate features that are relevant in the present context only. By means of a coordinate system three spatial directions are defined in the Figure. There are defined: a first lateral spatial direction, x-direction, and a second lateral spatial direction, y-direction, and a depth direction, z-direction. The three spatial directions are mutually perpendicular to each other.

Figure 1:
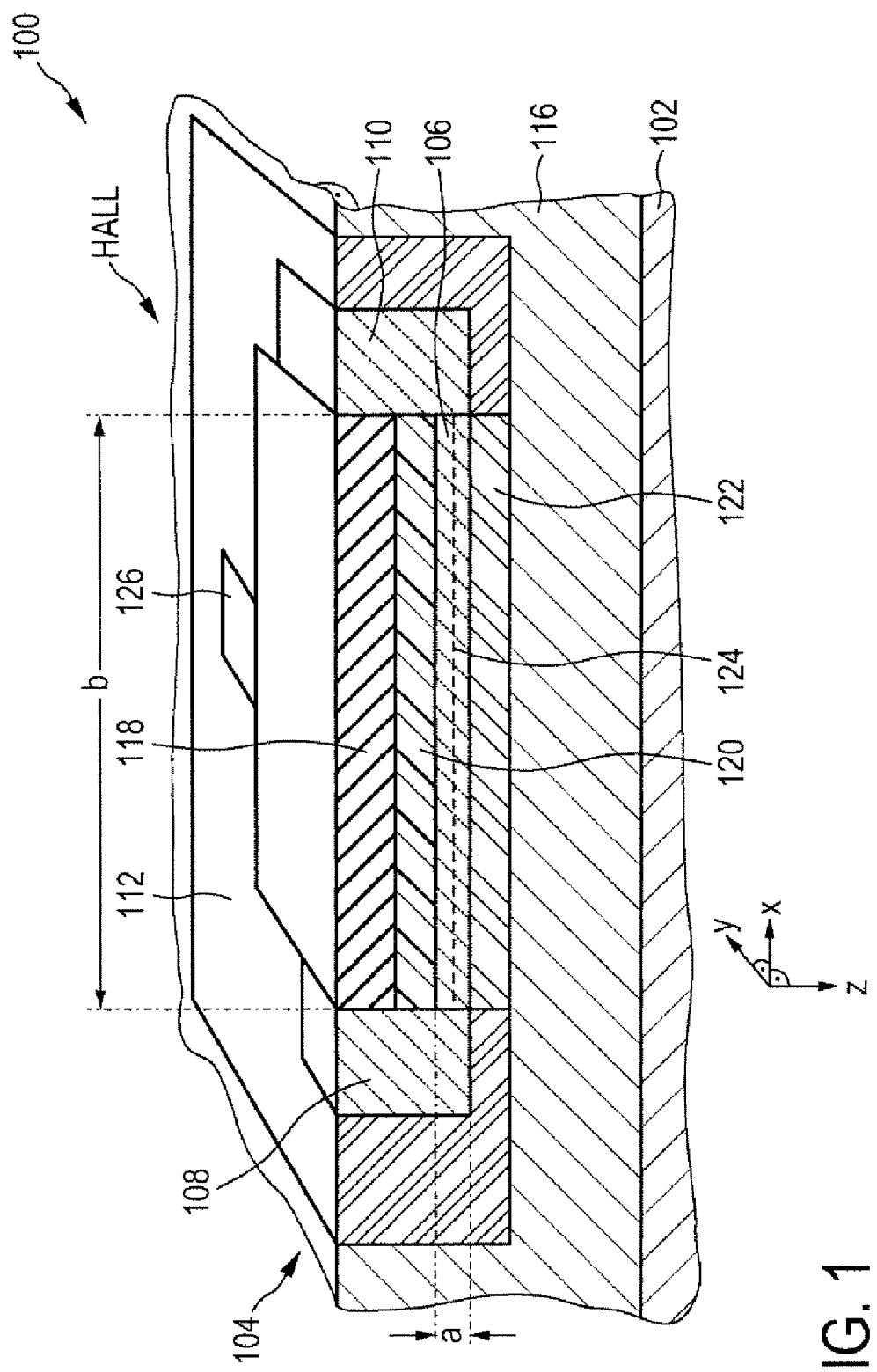
FIG. 1 illustrates a schematic partially perspective, partially sectional view of an integrated semiconductor device in an area corresponding to a Hall effect sensor, and FIG. 2 schematically illustrates a cross-sectional view of the integrated semiconductor element of FIG. 1 in the area of an NDMOS and in the area of a PDEMOS transistor.

FIG. 1 illustrates a semiconductor device 100 having the function of a Hall effect sensor. The Figure represents a three-dimensional schematic illustration of the semiconductor device 100, wherein a sectional view of the layer sequence of the semiconductor device is illustrated in the x-z plane.

According to this embodiment the semiconductor device 100 is implemented on a p-doped semiconductor substrate 102 in a first active region 104. The first active region 104 comprises a first doped region 106, which also acts as a drift zone and which is n-doped in this embodiment.

The first doped region 106 is a buried layer of height a below the substrate surface having a lateral extension in the y-direction and in the x-direction. The first doped region 106 acts as a Hall plate 124, which hereinafter is also referred to as a current flow plane. Formed adjacent to the first doped region 106 is a first doped contact region 108 that is n$^+$-doped. The first doped contact region 108 is in electrical contact with the first doped region 106 at a first boundary of the Hall plate 124 in the x-direction. A second doped contact region 110 is in electrical contact with the Hall plate at a second boundary of the Hall plate in the negative x-direction. The first and second doped contact regions 108, 110 extend from the substrate surface to a lower boundary of the first doped region 106 in the depth direction along the z-direction. The first and second doped contact regions 108, 110 act so as to electrically connect the Hall plate with an external current source. A first sensor contact 126 is in the y-direction electrically connected to the Hall plate. The first sensor contact 126 is an n-doped region extending from the substrate surface to the first doped region 106 along the depth direction. A second sensor contact that is in electrical contact with the first doped region at an oppositely positioned boundary in the y-direction of the Hall plate is not illustrated in the Figure.

A buried second doped region 120 that is p-doped is positioned above the first doped region 106 and thereabove an insulation region 118 is positioned that extends from the second buried doped region 120 to the substrate surface in the depth direction.

A third p-doped buried doped region 122 is positioned below the first doped region 106. The insulation region 118, the second buried doped region 120 and the buried third doped region 122 have the same lateral extension as the first doped region (drift zone 106), that is, in the x-direction and in the y-direction.

The entire Hall effect sensor structure described so far is embedded in a p-doped body region 112. By means of the doped body region 112 in combination with the third buried doped region 122 the Hall plate 124 and the doped contact regions are completely surrounded by p-doped areas and are electrically insulated from other structures on the same substrate by means of the depletion zones forming at the interfaces of n-doped and p-doped regions. This effect is further enhanced by an n-doped well 116, in which the Hall effect sensor structure and the doped body region 112 are embedded. In this manner, the Hall plate is insulated from the rest of the substrate. The Hall plate 124 has a length b and a height a. Typical lengths b are in the range of 1 μm.

A current flow in the current flow plane 124 through the Hall plate 124 in the x-direction therefore generates a Hall voltage in the y-direction when a magnetic field is present whose field lines extend in the z-direction. The current flow may be generated by applying a voltage between the first doped contact region 108 and the second doped contact region 110 and the Hall voltage may be tapped between the first sensor contact 126 and the second sensor contact that is not shown.

Figure 2:
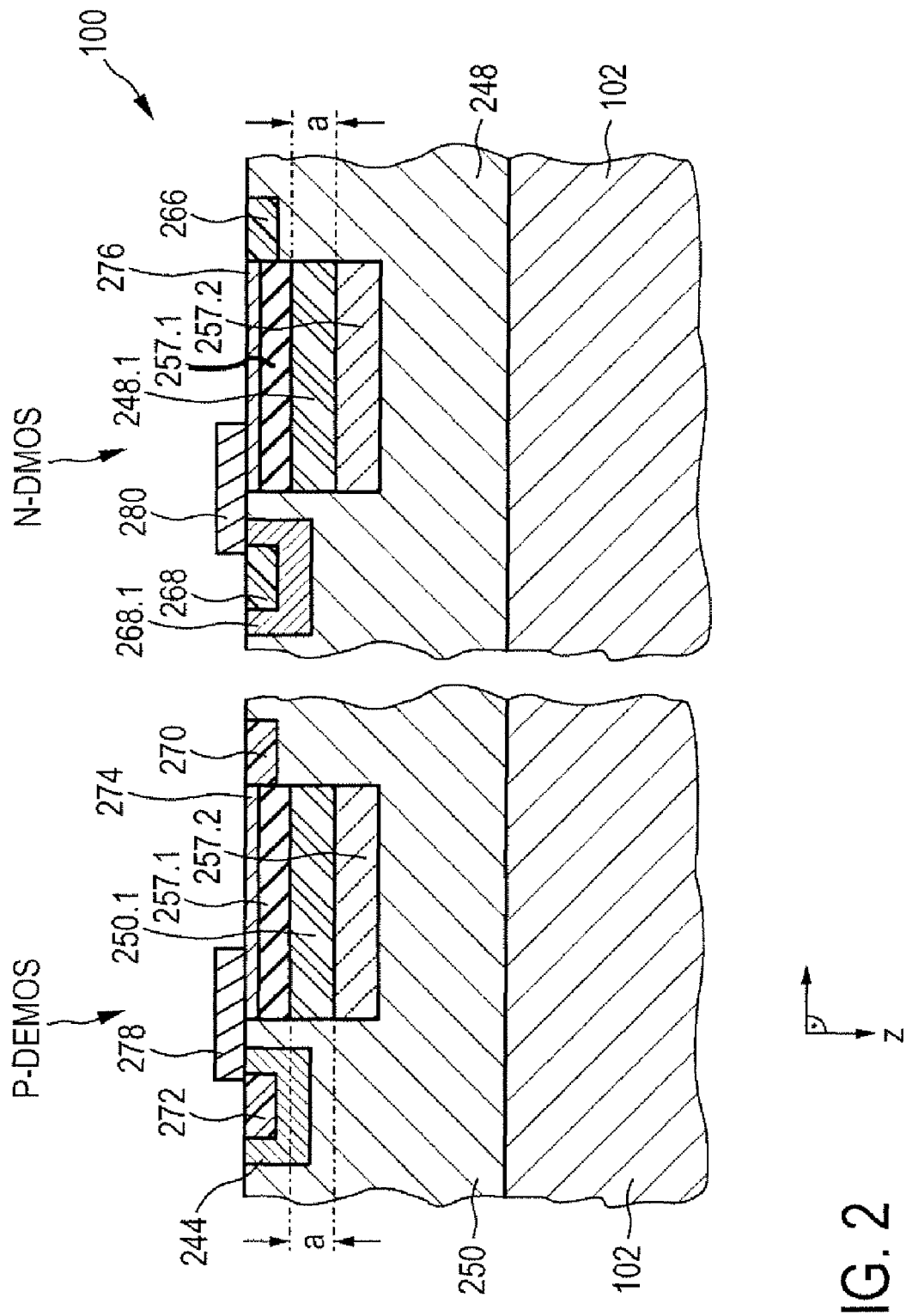

In FIG. 2 an embodiment of a semiconductor device 200 is illustrated, which is formed on a p$^+$ wafer 202. A first wafer portion comprises an N-DMOS transistor. A second portion comprises a P-DEMOS transistor.

The N-DMOS transistor consists of a deep n-conductive trench 248, which is also referred to as an n-well, a drain region 266, a source region 268 and a drift region 248.1. Above and below the drift region 248.1 of height a there are provided doped RESURF regions 257.1 and 257.2 for a double RESURF structure. The drift region section 248.1 is in this case n-doped and the doped RESURF regions 257.1 and 257.2 are p-doped. An insulation layer 276 is formed between the wafer surface and the doped RESURF region 257.1. Moreover, a p-doped body implantation region 268.1, also referred to as p-body region, is implanted around the source region. The doped RESURF regions typically have a dopant concentration of the same order of magnitude as the drift region, however with an integrated maximum dopant concentration in a vertical direction of approximately $1*10^{12}$ cm$^{-2}$.

Due to the double RESURF structure a depletion zone is generated upon application of a voltage to the drain electrode of the lateral high-voltage MOS transistor, which depletion zone extends along the boundary between the drift region and a substrate region of opposite conductivity positioned below. A further depletion zone is generated between the doped region formed under the surface of the drift region and the drift region itself. In this manner, a full depletion of charge carriers in the drift region is obtained by these two inversely biased pn-junctions, thereby causing a desired increase of the breakthrough voltage of the lateral high-voltage MOS transistor. At the same time the charge carrier concentration in the drift region may be increased by positioning the doped region in the drift region, thereby reducing the on resistance $R_{ON}$ of the lateral high-voltage MOS transistor. This is due to the fact that only the integrated effective doping of the drift region and of the doped regions formed therein is relevant for the magnitude of the breakthrough voltage in the inversely biased mode. For these purposes the embedded doped region, however, compensates for the dopant concentration of the drift region. Therefore, relatively high dopant concentrations may be used in the drift region, thereby finally increasing its conductivity and thus reducing $R_{ON}$ without reducing the breakthrough voltage.

A gate insulation region 280 is positioned on the substrate surface between the source region 268 and the drain region 266.

The second wafer portion comprises the second lateral high-voltage MOS transistor, ie. the P-DEMOS transistor. The P-DEMOS transistor comprises a p-doped source region 272 and a drain region 270, a deep n-conductive trench 250, which is also referred to as an n-well, and an n-doped body implantation region 244 around the source region. Furthermore, the lateral P-DEMOS transistor comprises a drift region portion 250.1. Above the drift region portion 250.1 a portion of the drain extension region (drift region) 257.1 is formed. The drain extension region 257.1 in combination with the drift region portion 250.1 and a p-doped portion 257.2 positioned below have the same vertical dopant profile in the P-DEMOS transistor as the double RESURF structure in the N-DMOS transistor consisting of the doped RESURF regions 257.1, 257.2 in the N-DMOS transistor and the drift region portion 258.1. The Hall effect sensor of FIG. 1 has also the same vertical dopant profile in the area of the Hall plate together with the second and third buried doped regions 120 and 122.

Therefore, the fabrication of the drain extension region 257.1 in the P-DEMOS transistor and the double RESURF structure in the N-DMOS transistor and the fabrication of the Hall plate and of the second and third buried doped regions 120, 122 in the Hall effect sensor is accomplished in a single mask step, that is, with one and the same implantation mask. For this purpose, the p-doped portions 257.1, 257.2 and 120, 122 and the n-doped portions 248.1, 250.1 and 124 are sequentially fabricated. The advantage of this strategy is that the double RESURF structure in the N-DMOS transistor and the portions of the drain extension region in the P-DEMOS transistor and the Hall plate in the Hall effect sensor are formed at the same time.

The vertical dopant profile of the drain extension region and of the drift region portion in the P-DEMOS transistor, the double RESURF structure in the N-DMOS transistor and the structure in the area of the Hall plate in the Hall effect sensor comprises p-doped and n-doped buried layers 257.1, 248.1, 250.1 and 250.2, i.e. the first, second and third buried doped regions 124, 120, 122 in the Hall effect sensor, in an alternating manner.

The insulation region 118 of FIG. 1 has the same vertical extension as the insulation layers 274 and 276 in the N-DMOS transistor and the P-DEMOS transistor. Therefore, the fabrication of the insulation region 118 and of the insulation layers 274 and 276 may be accomplished concurrently by means of the same process steps.

In the following a table of reference signs with brief explanations of the feature s of the semiconductor device as shown in FIGS. 1 and 2 is provided.

The Figures illustrate the following features:

FIG. 1
- 100 semiconductor device
- 102 semiconductor substrate p$^-$ doped
- 104 first active region
- 106 first doped region, also referred to as drift zone, n-doped
- 108 first doped contact region, n$^+$ doped
- 110 second doped contact region, n$^+$ doped
- 112 doped body region, p-doped, used for insulating the drift zone with respect to deep well 116
- 116 deep well, n-doped
- 118 insulation region
- 120 buried second doped region, p-doped
- 122 buried third doped region, p-doped
- 124 Hall plate, also referred to as current flow plane
- 126 first sensor contact for tapping a Hall voltage; the distance between the first and second sensor contacts in the y-direction is typically approximately 100 μm
- x first lateral direction, as indicated by the direction of the arrow
- y second lateral direction, as indicated by the direction of the arrow
- z depth direction
- x-, y- and z-directions are mutually perpendicular to each other.
- a distance between the second and third buried doped regions,
- b length of the Hall plate in the x-direction, typically approximately 3 μm FIG. 2
- PDEMOS P-DEMOS (drain extension metal oxide semiconductor) transistor
- NDMOS N-DMOS transistor
- 200 semiconductor device
- 202 p$^+$ wafer
- 244 n-doped body implantation region, also referred to as n-body region
- 248 deep n-conductive trench, also referred to as n-well
- 248.1 drift region portion in the N-DMOS transistor
- 250 deep n-conductive trench, also referred to as n-well
- 250.1 drift region in the N-DMOS transistor
- 257.1, 257.2 doped RESURF regions for double RESURF structure in the N-DMOS transistor and also concurrently portions of the drain extension regions (drift regions) in the P-DEMOS transistor
- 266 drain region of the N-DEMOS transistor
- 268 source region of the N-DEMOS transistor
- 268.1 p-body implantation region
- 270 drain region of the P-DEMOS transistor
- 272 source region of the P-DEMOS transistor
- 274 insulation region
- 276 insulation region
- 278 gate insulation region in the P-DEMOS transistor
- 280 gate insulation region in the N-DEMOS transistor

We claim as our invention:

1. A semiconductor device comprising an integrated circuit on a semiconductor substrate comprising a Hall effect sensor (HALL) in a first active region and a lateral high-voltage MOS transistor (NDMOS, PDEMOS) in a second active region, wherein the Hall effect sensor comprises
a first doped region of a first conductivity type, in the following referred to as drift zone, in the semiconductor substrate;
first and second doped contact regions of the first conductivity type, connected with the drift zone for generating a majority charge carrier current in the drift zone upon application of an operating voltage between the doped contact regions;
a second doped region of a second conductivity type inverse to the first conductivity type, which second doped region is positioned above the drift zone in a depth direction (z) pointing to an interior of the substrate, wherein the second doped region has a dopant concentration of $10^{15}$ to $5\times10^{17}$ cm$^{-3}$;
a third doped region of the second conductivity type positioned below the drift zone in the depth direction (z) with a first distance (a) from the second doped region and being overlapped with the second doped region in the first lateral direction;
wherein the first distance (a) and the lateral extensions of the second and third doped regions are selected such that upon application of the operating voltage across the doped contact regions the majority charge carrier current between the first and second doped contact regions flows in a first lateral direction (x) through a current flow plane of the drift zone positioned between the second and the third doped regions in the depth direction (z); and
sensor contacts having a second distance from each other in a second lateral direction (y) perpendicular to the first lateral direction (x) and connected with the drift zone and positioned and configured such that upon application of the operating voltage across the doped control contact regions a Hall voltage can be tapped at the sensor contact,
which is generated in the presence of a magnetic field component oriented perpendicularly to the current flow plane; and
wherein the lateral high-voltage MOS transistor in addition to a doped source region and a doped drain region comprises
a MOS transistor drift zone of the first conductivity type, which has the same dopant profile in the semiconductor substrate as the first doped region of the Hall effect sensor;
an upper RESURF zone of the second conductivity type adjacent to the MOS transistor drift zone in the depth direction (z) and having the same dopant profile in the depth direction (z) as the second doped region of the Hall effect sensor; and
a lower RESURF zone of the second conductivity type adjacent to the MOS transistor drift zone wherein the lower RESURF zone has the first distance (a) from the upper RESURF zone in the depth direction (z) and has the same dopant profile in the depth direction (z) as the third doped region of the Hall effect sensor.

2. The semiconductor device of claim 1, comprising an insulation region in the first active region, which insulation region is positioned at a surface of the semiconductor substrate in a first lateral direction (x) between the first and second doped contact regions and which is adjacent to the second doped region in the depth direction (z).

3. The semiconductor device of claim 2, wherein a MOS transistor insulation region is provided in the second active region at a surface of the semiconductor substrate in the first lateral direction (x) between a source contact and a drain contact of the high-voltage MOS transistor and whose extension in the depth direction (z) is less than that of the MOS transistor drift zone and is equal to an extension of the insulation region of the Hall effect sensor in the depth direction (z).

4. The semiconductor device of claim 2, wherein the upper doped RESURF region is positioned below the MOS transistor insulation region in the depth direction (z).

5. The semiconductor device of claim 2, wherein the lateral extensions of the second and third doped regions (120, 122) in the first lateral direction (x) are less or equal to the lateral extension of the insulation region (118) in the first lateral direction.

6. The semiconductor device of claim 1, wherein the doped contact regions of the Hall effect sensor (HALL) extend from a surface of the semiconductor substrate to the drift zone in the depth direction (z) and connect to ends of the drift zone in the first lateral direction (x), wherein at least one of the doped contact regions has a higher dopant concentration compared to the drift zone.

7. The semiconductor device of claim 1, wherein in the first active region the drift zone, the doped contact regions and the second and third doped regions are embedded with respect to the first and second lateral directions (x, y) in a doped body region of the second conductivity type.

8. The semiconductor device of claim 7, comprising a third control contact that is connected with the doped body region for applying a bias voltage that controls an extension of a space charge region in the drift zone.

9. The semiconductor device of claim 8, comprising, at a surface of the semiconductor substrate in the doped body region, a third doped contact region that is connected with the third control contact.

10. The semiconductor device of claim 7, wherein the doped body region is laterally and in the depth direction embedded into a fourth doped region of the first conductivity type.

11. The semiconductor device of claim 10, wherein the fourth doped region is configured as a well and connects, in the depth direction (z), to the semiconductor substrate having the second conductivity type.

12. The semiconductor device of claim 1, wherein the drift zone (106) has a dopant concentration of $10^{15}$ to $5*10^{17}$ cm$^{-3}$.

13. The semiconductor device of claim 1, wherein the lateral extension of the drift zone between the first and second doped contact regions is between 2 and 50 micrometers and wherein the distance of the sensor contacts from each other in the second lateral direction (y) is between 50 and 400 micrometer.

14. The semiconductor device of claim 1, wherein the MOS transistor drift zone in the second active region and the drift zone in the first active region have the same extension in the depth direction (z) and have the same dopant profile in the depth direction.

15. The semiconductor device of claim 1, wherein the integrated circuit additionally comprises an analog to digital converter configured to detect at an input an electrical voltage between the sensor contacts and to output at an output thereof a digital signal dependent on the detected electrical voltage.

* * * * *